(12) United States Patent
Vest

(10) Patent No.: US 10,139,730 B2
(45) Date of Patent: Nov. 27, 2018

(54) METHOD AND APPARATUS FOR PRODUCING LIQUID FLEXOGRAPHIC PRINTING PLATES

(71) Applicant: MacDermid Graphics Solutions, LLC, Waterbury, CT (US)

(72) Inventor: Ryan W. Vest, Cumming, GA (US)

(73) Assignee: MacDermid Graphics Solutions LLC, Waterbury, CT (US)

( * ) Notice: Subject to any disclaimer, the term of this patent is extended or adjusted under 35 U.S.C. 154(b) by 71 days.

(21) Appl. No.: 15/493,498

(22) Filed: Apr. 21, 2017

(65) Prior Publication Data

US 2017/0219924 A1  Aug. 3, 2017

Related U.S. Application Data

(62) Division of application No. 14/935,963, filed on Nov. 9, 2015, now Pat. No. 9,740,103.

(51) Int. Cl.
| | |
|---|---|
| *G03F 7/20* | (2006.01) |
| *B41N 1/06* | (2006.01) |
| *G03F 7/26* | (2006.01) |

(52) U.S. Cl.
CPC ............... *G03F 7/20* (2013.01); *B41N 1/06* (2013.01); *G03F 7/2022* (2013.01); *G03F 7/2055* (2013.01); *G03F 7/26* (2013.01)

(58) Field of Classification Search
None
See application file for complete search history.

(56) References Cited

U.S. PATENT DOCUMENTS

| | | | |
|---|---|---|---|
| 3,537,853 A | 11/1970 | Wessells et al. | |
| 3,597,080 A | 8/1971 | Gush et al. | |
| 3,794,494 A | 2/1974 | Kai et al. | |
| 3,857,635 A | 12/1974 | Niehaus | |
| 3,960,572 A | 6/1976 | Ibata et al. | |
| 4,442,302 A | 4/1984 | Pohl | |
| 5,213,949 A | 5/1993 | Kojima et al. | |
| 5,813,342 A | 9/1998 | Strong | |
| 2004/0177782 A1 | 9/2004 | McCrea et al. | |
| 2008/0107908 A1 | 5/2008 | Long et al. | |
| 2009/0042138 A1 | 2/2009 | Roberts et al. | |

(Continued)

OTHER PUBLICATIONS

International Search Report and Written Opinion issued in PCT/US2016/057466, dated Dec. 28, 2016 (15 pages).

*Primary Examiner* — Joshua D Zimmerman
(74) *Attorney, Agent, or Firm* — Carmody Torrance Sandak & Hennessey LLP

(57) ABSTRACT

A method of selectively exposing a liquid photopolymer printing blank to actinic radiation to create a relief image printing plate and a liquid platemaking exposure system. The method includes: (1) positioning a programmable screen programmed with an image file of a desired image between the top glass and an upper source of actinic radiation; (2) exposing the layer of liquid photopolymer to actinic radiation from the upper source of actinic radiation through the programmable screen to crosslink and cure at least a portion of the liquid photopolymer adjacent to the backing sheet and create a floor layer therein; and (3) imagewise exposing the layer of liquid photopolymer to actinic radiation from a lower source of actinic radiation through a negative of the relief image to crosslink and cure selective portions of the liquid photopolymer on the floor layer and create the relief image therein.

10 Claims, 2 Drawing Sheets

(56) References Cited

U.S. PATENT DOCUMENTS

| | | |
|---|---|---|
| 2010/0141969 A1 | 6/2010 | Brazier |
| 2012/0082932 A1 | 4/2012 | Battisti et al. |
| 2012/0171620 A1 | 7/2012 | Bryant |
| 2012/0174806 A1 | 7/2012 | Spoor et al. |
| 2014/0080042 A1 | 3/2014 | Maneira |

METHOD AND APPARATUS FOR PRODUCING LIQUID FLEXOGRAPHIC PRINTING PLATES

CROSS REFERENCE TO RELATED APPLICATIONS

This application is a divisional of U.S. application Ser. No. 14/935,693 filed on Nov. 9, 2015, now pending, the subject matter of which is herein incorporated by reference in its entirety.

FIELD OF THE INVENTION

The present invention relates generally to improved methods of producing relief image printing elements from liquid photoresins.

BACKGROUND OF THE INVENTION

Flexographic printing is widely used in the production of newspapers and in the decorative printing of packaging media. Numerous photosensitive printing plate formulations have been developed to meet the demand for fast, inexpensive processing and long press runs.

Photosensitive printing elements generally comprise a support layer, one or more photosensitive layers, an optional slip film release layer, and an optional protective cover sheet. The protective cover sheet is formed from plastic or any other removable material that can protect the plate or photocurable element from damage until it is ready for use. If used, the slip film release layer is typically disposed between the protective cover sheet and the photocurable layer(s) to protect the plate from contamination, increase ease of handling, and act as an ink-accepting layer. After exposure and development, the photopolymer flexographic printing plate consists of various image elements supported by a floor layer and anchored to a backing substrate.

It is highly desirable that flexographic printing plates work well under a wide range of conditions. For example, the printing plates should be able to impart their relief image to a wide range of substrates, including cardboard, coated paper, newspaper, calendared paper, and polymeric films such as polypropylene. Importantly, the image should be transferred quickly and with fidelity, for as many prints as the printer desires to make.

Flexographic printing elements can be manufactured in various ways including with sheet polymers and by the processing of liquid photopolymer resins. Flexographic printing elements made from liquid photopolymer resins have the advantage that uncured resin can be reclaimed from the non-image areas of the printing elements and used to make additional printing plates. Liquid photopolymer resins have a further advantage as compared to sheet polymer in terms of flexibility, which enables the production of any required plate gauge simply by changing the machine settings.

Various processes have been developed for producing printing plates from liquid photopolymer resins as described, for example, in U.S. Pat. No. 5,213,949 to Kojima et al., U.S. Pat. No. 5,813,342 to Strong et al., U.S. Pat. Pub. No. 2008/0107908 to Long et al., and U.S. Pat. No. 3,597,080 to Gush, the subject matter of each of which is herein incorporated by reference in its entirety.

Typical steps in the liquid platemaking process include:
(1) casting and exposure;
(2) reclamation;
(3) washout;
(4) post exposure;
(5) drying; and
(6) detackification.

In the casting and exposure step, a photographic negative is typically placed on a bottom glass platen and a coverfilm is placed over the negative in an exposure unit. The exposure unit generally comprises the bottom glass platen with a source of UV light below it (lower light) and a lid having flat top glass platen with a source of UV light above it (upper light).

Precise reproduction of the negative image detail onto the photopolymer requires that the negative be placed as close to the photopolymer layer as possible. All of the air is removed by vacuum so that any wrinkling of the negative or coverfilm can be eliminated. In addition, the bottom glass platen may be grooved to further remove any air between the coverfilm and the negative. Thereafter, a layer of liquid photopolymer and a backing sheet (i.e., a thin layer of polyester or polyethylene terephthalate) are cast on top of the coverfilm and negative to a predetermined thickness. A backing sheet, which may be coated on one side to bond with the liquid photopolymer, is laminated over the cast liquid photopolymer layer to serve as the back of the plate after exposure.

Upper and/or lower sources of actinic radiation (i.e., the upper and lower lights) are used to expose the photopolymer to actinic radiation to selectively crosslink and cure the liquid photopolymer layer in the areas not covered by the negative. The top sources of actinic radiation are used to create the floor layer of the printing plate (i.e., back exposure) while the bottom sources of actinic radiation are used to face expose the photopolymer to actinic radiation through the negative to create the relief image. Plate gauge may be set by positioning a top exposure glass at a desired distance from a bottom exposure glass after dispensing liquid photopolymer on the protected bottom exposure glass.

The upper light source is turned on for a prescribed amount of time to cause the photopolymer adjacent to the substrate to crosslink uniformly over the entire surface of the plate, forming the floor. Thereafter, areas to be imaged are exposed to actinic radiation from the lower light source (i.e., through the bottom glass platen). The actinic radiation shines through the clear areas of the negative, which causes the photopolymer to crosslink in those areas, forming the relief image that bonds to the floor layer. The liquid photopolymer that is not exposed to the lower light source (i.e., the uncured photopolymer) remains in a liquid state and can be reclaimed and reused.

The type of radiation used is dependent in part on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units, photographic flood lamps, and light emitting diodes (LEDs), in which the wavelength of emitted light is determined by the materials used in the active region of the semiconductor.

After the exposure is complete, the printing plate is removed from the exposure unit and the photopolymer that was not exposed to actinic radiation (i.e., the photopolymer covered by the negative) remains liquid and can be reclaimed for further use. In liquid platemaking, resin recovery is an important factor relating to the production of photopolymerizable resin printing plates because the resins used are relatively expensive. In all areas not exposed to UV radiation, the resin remains liquid after exposure and can be reclaimed. In a typical process, the uncured resin is physically removed from the plate in a process step so that the uncured resin can be reused in making additional plates. This "reclamation" step typically involves squeegeing, vacuuming or otherwise removing liquid photopolymer remaining on the surface of the printing plate. This reclamation step not only saves material costs of the photopolymer resin but also reduces the use and cost of developing chemistry and makes a lighter plate that is safer and easier to handle.

Any residual traces of liquid resin remaining after the reclamation step may then be removed by nozzle washing or brush washing using a wash-out solution to obtain a washed-out plate, leaving behind the cured relief image. Typically, the plate is placed into a washout unit where an aqueous solution comprising soap and/or detergent is used to wash away any residual unexposed photopolymer. The plate is then rinsed with water to remove any residual solution.

The cured regions of the printing element are insoluble in the washout (or development) solution, and so after washout, a relief image formed of cured photopolymerizable resin is obtained. The cured resin is likewise insoluble in certain inks, and thus may be used in flexographic printing.

Thereafter, the printing plate is subjected to various post exposure and detackification steps. Post exposure may involve submerging the plate in a water and salt solution and performing an additional exposure of the printing plate to actinic radiation (UV light) to fully cure the printing plate and to increase plate strength. The printing plate may then be rinsed and dried. The detackification step (if used) may involve the use of a germicidal unit (light finisher) to ensure a totally tack-free plate surface. This step is not require for all plates, as certain resins may be tack-free and thus printing press ready without the need for the detackification step.

Typically, the floor area on a traditional flexographic printing element prepared from a liquid photopolymer accounts for at least about half of the plate thickness, with the remainder of the plate thickness being the relief area. The floor gives dimensional stability to the plate and provides support to the relief area. However, because so much of the photopolymer is used up in making a floor that covers the entire sheet, a variation on this process has been developed that minimizes the floor area and significantly increases the amount of liquid photopolymer that may be reclaimed. These printing plates are commonly referred to as "imposition plates," "island plates," or "I-plates."

I-plates are made by adding another step to the liquid platemaking process. Instead of making a floor that that extends over the entire plate, a second photographic negative is placed on top of the photopolymer layer. This negative (also referred to as a masking film) outlines the image areas on the negative. The plates are first exposed to the upper UV light from the lid through the masking film, causing islands of cured polymer to be formed beginning in the photosensitive layer adjacent to the substrate. The timing and intensity of the exposure are limited to prevent the polymerization extending all the way through the photopolymer layer from the substrate to the free surface of the layer. The second lower UV exposure, from below the relief image negative, then causes the cured detailed relief image to form on top of the islands thus created. This process is described, for example, in U.S. Pat. Pub. No. 2012/0082932 to Battisti et al. and U.S. Pat. Pub. No. 2014/0080042 to Maneira, the subject matter of each of which is herein incorporated by reference in its entirety. The relief image negative and masking film are aligned so that each image area of the relief image negative is approximately in the middle of each clear area of the masking film.

One of the difficulties in producing I-plates is in the registering of the masking film with the negative in the set up process so that the islands created in the floor area will line up with the desired relief image. The masking film is typically applied over the surface of the substrate and can slip, causing the masking film to mis-register. U.S. Pat. Pub. No. 2012/0082932 to Battisti et al. attempts to solve this problem by using a substrate that has been printed with a digital representation of the island image that is then adhered to the layer of liquid photopolymer.

Related application Ser. No. 14/693,062 to Vest et al., the subject matter of which is herein incorporated by reference in its entirety, describes another method of producing an I-plate in which a liquid photopolymer printing blank is selectively exposed to actinic radiation to create a relief image printing plate by scanning a light bar comprising a plurality of UV LEDs across an upper surface of the liquid photopolymer printing blank through the backing sheet to cure the layer of liquid photopolymer in selected areas, creating islands of cured polymer adjacent to the backing sheet. The light bar comprises a plurality of UV LEDs arranged across the width of the light bar so that as the light bar scans over the surface of the liquid photopolymer printing blank, the surface of the liquid photopolymer printing blank may be subjected to crosslinking and curing to create cured islands therein.

One of the more time consuming steps in the platemaking process is the creation of the masking film and/or the relief image negative. There remains a need in the art for a streamlined process for creating printing plates from liquid photoresins that allows one to proceed from plate to press more quickly.

SUMMARY OF THE INVENTION

It is an object of the present invention to provide an improved liquid photopolymer plate making process.

It is another object of the present invention to provide an improved liquid platemaking process that eliminates the need for a masking film and/or negative in the liquid photopolymer platemaking process.

To that end, in one embodiment, the present invention relates generally to a method of selectively exposing a liquid photopolymer printing blank to actinic radiation to create a relief image printing plate, wherein the liquid photopolymer printing blank is produced by the steps of (i) placing a negative of a desired relief image on a bottom glass and placing a coverfilm over the negative of the desired relief image, (ii) disposing a layer of liquid photopolymer on top of the coverfilm and negative of the desired relief image to a predetermined thickness, (iii) placing a backing sheet over the cast liquid photopolymer layer, and (iv) placing a top glass over the backing sheet, the method comprising the steps of:

a. positioning a programmable screen between the top glass and an upper source of actinic radiation, wherein the programmable screen is programmed with an image file of a desired image;

b. exposing the layer of liquid photopolymer to actinic radiation from the upper source of actinic radiation through the programmable screen for a period of time to crosslink and cure at least a portion of the liquid photopolymer adjacent to the backing sheet and create a floor layer therein; and c. thereafter, imagewise exposing the layer of liquid photopolymer to actinic radiation from a lower source of actinic radiation through the bottom of the liquid photopolymer printing blank through the photographic negative to crosslink and cure selective portions of the liquid photopolymer on the floor layer and create the relief image therein.

In another embodiment, the present invention also relates generally to a method of selectively exposing a liquid photopolymer printing blank to actinic radiation to create a relief image printing plate, wherein the liquid photopolymer printing blank is produced by the steps of (i) disposing a first programmable screen between a lower source of actinic radiation and a bottom glass, wherein the firsts programmable screen is programmed with an image file of a desired relief image; (ii) placing a coverfilm on the bottom glass, (iii) disposing a layer of liquid photopolymer on top of the coverfilm to a predetermined thickness, (iv) placing a backing sheet over the cast liquid photopolymer layer, and (v) placing a top glass over the backing sheet, the method comprising the steps of:

a. positioning a second programmable screen above the top glass, wherein the second programmable screen is programmed with an image file of a desired floor image;

b. exposing the layer of liquid photopolymer to actinic radiation through the second programmable screen for a period of time to crosslink and cure at least a portion of the liquid photopolymer adjacent to the backing sheet and create the desired floor image therein; and c. thereafter, imagewise exposing the layer of liquid photopolymer to actinic radiation through the bottom of the liquid photopolymer printing blank through the first programmable screen to crosslink and cure selective portions of the liquid photopolymer on the floor layer and create the desired relief image therein.

BRIEF DESCRIPTION OF THE DRAWINGS

For a fuller understanding of the invention, reference is had to the following description taken in connection with the accompanying figures, in which.

Also, while not all elements may be labeled in each figure, all elements with the same reference number indicate similar or identical parts.

DETAILED DESCRIPTION OF THE PREFERRED EMBODIMENTS

Figure 1:
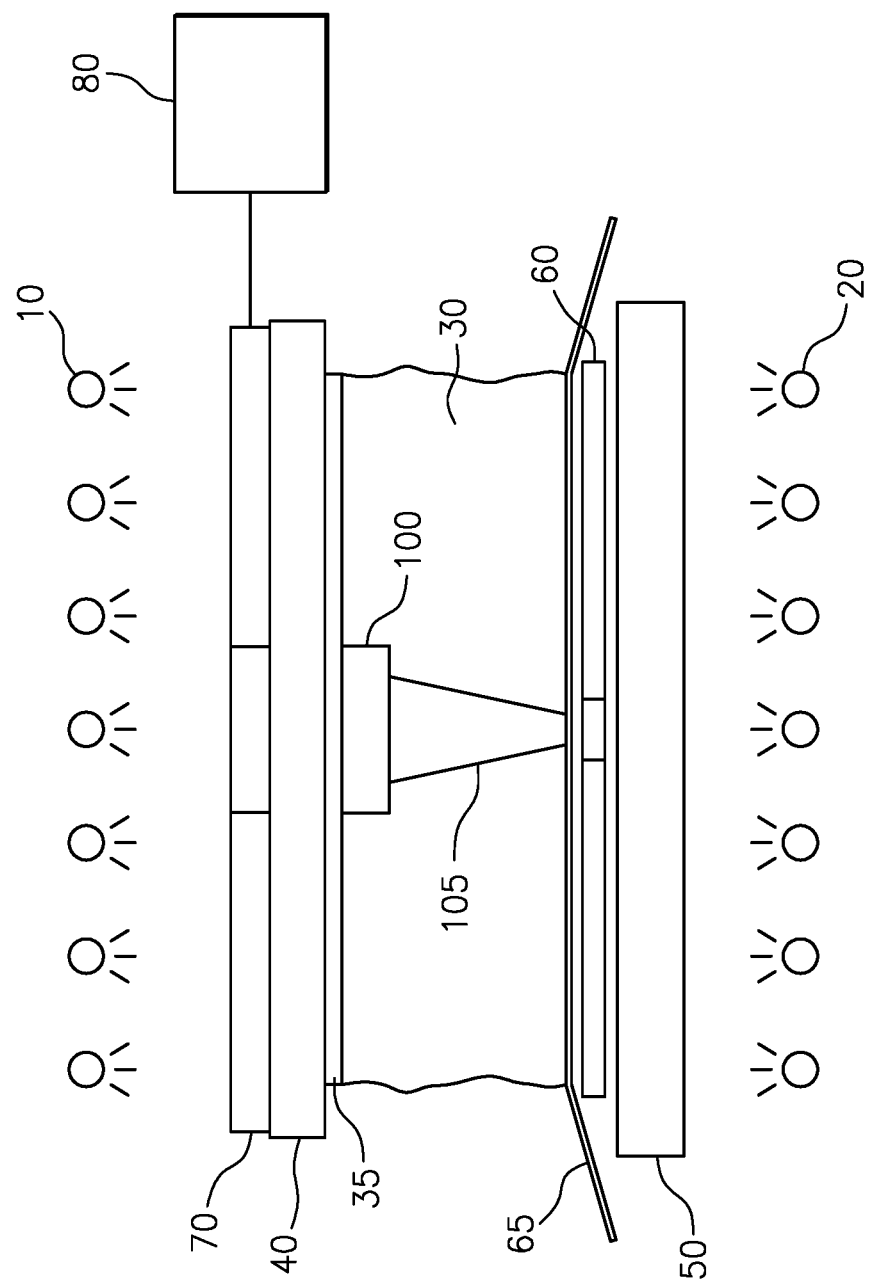
FIG. 1 depicts a liquid platemaking arrangement in accordance with one embodiment of the present invention.

The present invention relates generally to an improved method of exposing liquid flexographic printing elements in an in-position framework that eliminates the need for a masking film and/or photographic negative to create islands or other floor structure in the layer of liquid photopolymer adjacent to the substrate from the upper UV light source.

In one embodiment, the present invention relates generally to a method of selectively exposing a liquid photopolymer printing blank to actinic radiation to create a relief image printing plate, wherein the liquid photopolymer printing blank is produced by the steps of (i) placing a negative of a relief image on a bottom glass and placing a coverfilm over the negative of the relief image, (ii) disposing a layer of liquid photopolymer on top of the coverfilm and negative of the relief image to a predetermined thickness, (iii) placing a backing sheet over the cast liquid photopolymer layer, and (iv) placing a top glass over the backing sheet, the method comprising the steps of:

a. positioning a programmable screen between the top glass and an upper source of actinic radiation, wherein the programmable screen is programmed with an image file of a desired image;

b. exposing the layer of liquid photopolymer to actinic radiation from the upper source of actinic radiation through the programmable screen for a period of time to crosslink and cure at least a portion of the liquid photopolymer adjacent to the backing sheet and create a floor layer therein; and c. thereafter, imagewise exposing the layer of liquid photopolymer to actinic radiation from a lower source of actinic radiation through the bottom of the liquid photopolymer printing blank through the negative of the relief image to crosslink and cure selective portions of the liquid photopolymer on the floor layer and create a relief image therein.

In one embodiment, the floor layer created in the at least one layer of photopolymer comprises a plurality of cured islands, and the relief image is created on the cured islands.

If desired, once the liquid photopolymer has been exposed to actinic radiation from the upper source of actinic radiation through the programmable screen, the programmable screen may be reprogrammed to present an opaque screen to at least substantially prevent light reflecting from the top glass during the subsequent imagewise exposure step.

Once the plate has been imagewise exposed to create the relief image therein, the plate-making arrangement may be removed from the unit for further processing to reveal the relief image therein. Thereafter, the programmable screen may be reprogrammed for the next plate.

In another embodiment, the programmable screen may change or modify programs mid-plate cycle, for example, where it is desirable to provide a full back exposure followed by a mask exposure. Thus, the programmable screen may be programmed to first allow a first exposure to actinic radiation across the entirety of the printing element to a sufficient depth to create a cured floor layer of a desired thickness therein. Thereafter, the program can be modified to create islands of cured photopolymer on the cured floor layer. In this manner, a relief image printing element can be prepared having thin floor layer that is used to support a plurality of islands on which the desired relief image is then created. In another, embodiment, the programmable screen can be used to apply a tint screen if the user simply wants to filter the back exposure, such as while making super thin plates with a fast photopolymer.

In another embodiment of the present invention, the programmable screen described herein may also be used in place of the relief image negative. Thus, in this instance, both the masking film and the relief image negative can be replaced with programmable screens.

Based thereon, the present invention also relates generally to a method of selectively exposing a liquid photopolymer printing blank to actinic radiation to create a relief image printing plate, wherein the liquid photopolymer printing blank is produced by the steps of (i) disposing a first programmable screen between a lower source of actinic radiation and a bottom glass, wherein the first programmable screen is programmed with an image file of a desired relief image; (ii) placing a coverfilm on the bottom glass, (iii) disposing a layer of liquid photopolymer on top of the coverfilm to a predetermined thickness, (iv) placing a backing sheet over the cast liquid photopolymer layer, and (v) placing a top glass over the backing sheet, the method comprising the steps of:

a. positioning a second programmable screen above the top glass, wherein the second programmable screen is programmed with an image file of a desired floor image;

b. exposing the layer of liquid photopolymer to actinic radiation through the second programmable screen for a period of time to crosslink and cure at least a portion of the liquid photopolymer adjacent to the backing sheet and create the desired floor image therein; and c. thereafter, imagewise exposing the layer of liquid photopolymer to actinic radiation through the bottom of the liquid photopolymer printing blank through the first programmable screen to crosslink and cure selective portions of the liquid photopolymer on the floor layer and create the desired relief image therein.

The use of the programmable screen in accordance with the present invention allows for on-the-fly modifications to the image file program so that the desired relief image can be accurately registered with the islands created adjacent the substrate to provide for a more accurately imaged printing element. In addition, the use of the programmable screen also allows a user to more quickly and easily make multiple plates of the same image or multiple plates of different images simply by changing the image displayed by the screen.

The programmable screen of the present invention preferably has a thickness of less than about 5 mm, more preferably less than about 2 mm.

In one embodiment, the flexible programmable screen is positioned directly on the top glass and is held in place with suitable securing means so that it remains securely in position during the exposure step. In another embodiment, the flexible programmable screen may be spaced at a selected distance from the top glass and held securely in place with suitable securing means during the exposure step. Likewise, if a second flexible programmable screen is used in place of the relief image negative, it may be positioned directly below the bottom glass or may be spaced at a selected distance from the bottom glass and would also be held in place with suitable securing means. As in any process in which an image is formed blocking light by interposing a mask or screen over a photocurable layer, the closer the programmable mask is to the surface, the sharper the image that is formed. Thus, in some embodiments, it may be necessary to use a collimator or other means for modifying the angle of light from the source of actinic radiation to produce a sharp image in the liquid photopolymer.

In the alternative, it is also contemplated, that a clear cover film may be placed over the layer of liquid photopolymer so that the programmable screen may be positioned directly over the layer of liquid photopolymer under the top exposure glass or, if a second programmable screen is used, placed in a similar manner as a photographic negative in a conventional liquid platemaking process. It is believed that one skilled in the art could determine the best placement and configuration of the programmable screen(s) to produce high quality relief image printing plates.

The programmable screen is a device capable of modulating the projected intensity of individual picture elements or pixels in real time. A pixel is the smallest element of an image, for example in a liquid crystal display (LCD). The programmable screen is capable of rapidly transforming itself between two states (i.e., "on" and "off") when provided with suitable control signals. In a preferred embodiment, the programmable comprises a plurality of light valves or optical shutters. By light valve or optical shutter, what is meant is that the element can be switched between two states. In the first state, radiation incident on the element is blocked so that light is not transmitted through the programmable screen and the cell is "opaque." In the second state, the incident radiation is transmitted or reflected to follow a path through the cell of the programmable screen. Thus, the programmable screen may comprise an array of light valves or optical shutters and the array may be a transmission- or reflective liquid crystal display (LCD), a digital mirror device (DMD), an array of organic light emitting diodes (OLED) or a grating light valve array as described, for example in U.S. Pat. No. 6,177,980 to Johnson, the subject matter of which is herein incorporated by reference in its entirety. In a preferred embodiment, the programmable screen comprises a closely packed array of LCDs or OLEDs.

In addition, the programmable screen comprises a controller, preferably a microcontroller, operatively connected thereto. The controller controls each of the individual light valves in the programmable screen to selectively turn on/off each of the plurality of individual light valves in the programmable screen so that the individual light valve is either "on," during which time light is transmitted through the light valve of the programmable screen, or "off," during which time light is not transmitted through the light valve of the programmable screen, to produce the desire pattern in the programmable screen. In addition, the controller may also control the duration of time the light valves are on/off in order to control the shape and thickness of the islands and other features. By controlling the individual light valves in the programmable screen, the controller is capable of controlling the size, thickness and location of islands created in the layer of liquid photopolymer or the thickness of the floor layer created in the layer of liquid photopolymer.

The controller also comprises software for controlling the operation of the light valves and data storage means for storing data related to the each individual light valve in the programmable screen. A user interface is operatively connected to the controller and to the programmable screen and comprises means for entering data into the data storage means and means for selecting information relating to the programmable screen. The user interface may comprise a touch screen or other input means and the microcontroller stores information relating to the number/size/shape/depth/location of the islands to be created in the photopolymer adjacent to the substrate. In addition, the processor is also capable of verifying that the programmable screen is registered with the relief image negative and adjusting or modifying the state of the cells (i.e., on/off) to adjust the openings in the programmable screen to line up with the relief image negative. The processor can also control the operation of the light valves so that all of the light valves are "off" so that programmable screen is opaque in order to prevent light reflecting from the top glass during the imagewise exposure step. Finally, it is also contemplated that the programmable screen can be used to produce different sizes of relief image printing plates due to the programmability of the screen.

After the desired relief image is created in the relief image printing plate by selectively crosslinking and curing portions of the layer of liquid photopolymer, the uncured (i.e., liquid) photopolymer remaining on the surface of the relief image may be removed by various methods, including squeegeeing or vacuuming the liquid photopolymer from the relief surface of the relief image printing plate.

The photopolymer resin for use in the layer of liquid photopolymer may be any material which is both fluid when uncured and that hardens upon exposure to selective wavelengths of actinic radiation. Such photopolymer resins are very commonly used in the photopolymer printing plate making industry, and are thus well known to those skilled in that art. One or more different photopolymer resins or resin compositions may be employed.

Any liquid photopolymer resin that is a fluid when uncured and that hardens upon exposure to selective wavelengths of actinic radiation may be used in the practice of the present invention. Examples of liquid curable photopolymer resins include those described in U.S. Pat. No. 3,537,853 to Wessells et al., U.S. Pat. No. 3,794,494 to Kai et al., U.S. Pat. No. 3,960,572 to Ibata et al. and U.S. Pat. No. 4,442,302 to Pohl, the subject matter of each of which is herein incorporated by reference in its entirety. The liquid photopolymer resin may also include additives such as antioxidants, accelerators, dyes, inhibitors, activators, fillers, pigments, antistatic agents, flame-retardant agents, thickeners, thixotropic agents, surface active agents, light scattering agents, viscosity modifiers, extending oils, plasticizers, and detackifiers, by way of example and not limitation. These additives may be pre-blended with one or monomers or other compounds to be polymerized. Various fillers, including for example, natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, etc. may also be included in the photopolymer composition in amounts that will not interfere with or otherwise inhibit the photocuring reaction or other steps in the platemaking process.

Preferably, the coverfilm that is placed on the exposure glass is either a biaxially oriented polypropylene (BOPP) film, a polyester film, or a polyethylene terephthalate (PET) film and is preferably transparent to actinic radiation. To aid in removal, the coverfilm may be treated with a release agent such as a silicone release agent or other release agent known in the art. Also, in a preferred embodiment, a vacuum is drawn on the coverfilm in order to remove creases and hold it in place on the exposure glass. The imagewise exposure to actinic radiation is from the frontside of the photopolymerizable layer and includes the image or film negative being placed on the coverfilm layer.

The photopolymer resin layer is then disposed over the coverfilm and negative (if used). This step may preferably be accomplished by casting. Substantially simultaneously with casting the photopolymer resin layer, a backing sheet is laminated or otherwise placed on the photopolymer resin layer. This backing sheet may preferably comprise a material selected from the group consisting of polyester films, acrylic films, acrylonitrile-butadiene-styrene resins, phenolic resins, and combinations of one or more of the foregoing, given by way of example rather than limitation. This backing sheet should be transparent or translucent to actinic radiation. In addition, if desired, the backing sheet may be coated, such as with a tie coat layer, so that the liquid photopolymer more securely bonds to the backing sheet.

Various means are known in the art for dispensing the liquid photopolymer layer onto the negative on the exposure glass and for removing entrapped air or gases in the liquid photopolymer layer so that gas bubbles are not formed in the photopolymer layer that would adversely affect printing performance. In addition, as described in U.S. Pat. No. 3,597,080, a heating element may be provided to maintain the fluidity of the liquid photopolymer composition in the storage tank housing and prevent the liquid photopolymer composition from congealing on a doctor blade which is provided to remove excess composition from the exposure glass. In addition, depending on the viscosity of the liquid photopolymer, a nonporous material may be placed around the desired perimeter of the negative to control the flow of the liquid photopolymer over the negative and maintain the thickness of the liquid photopolymer prior to curing.

The source of actinic radiation for both the upper light source and the lower light source can be any conventional source of actinic radiation. Examples of suitable visible and UV sources include carbon arcs, mercury-vapor arcs, fluorescent lamps, electron flash units, electron beam units, photographic flood lamps, and light emitting diodes (LEDs), in which the wavelength of emitted light is determined by the materials used in the active region of the semiconductor.

As shown in FIG. 1, the present invention also relates generally to system for producing a relief image printing plate from a liquid photopolymer resin, the system comprising:

a. an upper source of actinic radiation 10 and a lower source of actinic radiation 20 for exposing the liquid photopolymer resin 30 to actinic radiation to crosslink and cure portions of the liquid photopolymer resin 30;

b. a top exposure glass 40 and a bottom exposure glass 50 arranged between the upper source of actinic radiation 10 and the lower source of actinic radiation 20 for confining the liquid photopolymer resin 30 during production of the relief image printing plate;

c. a relief image negative 60 arranged between the bottom exposure glass 50 and the liquid photopolymer 30, wherein the relief image negative 60 comprises transparent portions and opaque portions, wherein the transparent portions define areas where the liquid photopolymer 30 can be exposed to be exposure to actinic radiation from the lower source of actinic radiation 20 through the bottom exposure glass 50 to crosslink and cure portions of the liquid photopolymer 30, and wherein the opaque portions define areas where the liquid photopolymer 30 is not to exposed to actinic radiation and is not cured; and d. a programmable screen 70 arranged between the top exposure glass 40 and the upper source of actinic radiation 10, wherein the programmable screen 70 is programmable with an image file of a desire image, said image file comprising transparent portions and opaque portions.

As described herein, the system also comprises a controller 80 operatively connected to the programmable screen 70 for individually controlling operation of each of the plurality of light valves or optical shutters in the programmable screen 70. The controller 80 comprises software for controlling operation of each of the plurality of light valves or optical shutters and data storage means for storing data related to each of the plurality of light valves or optical shutters.

Figure 2:
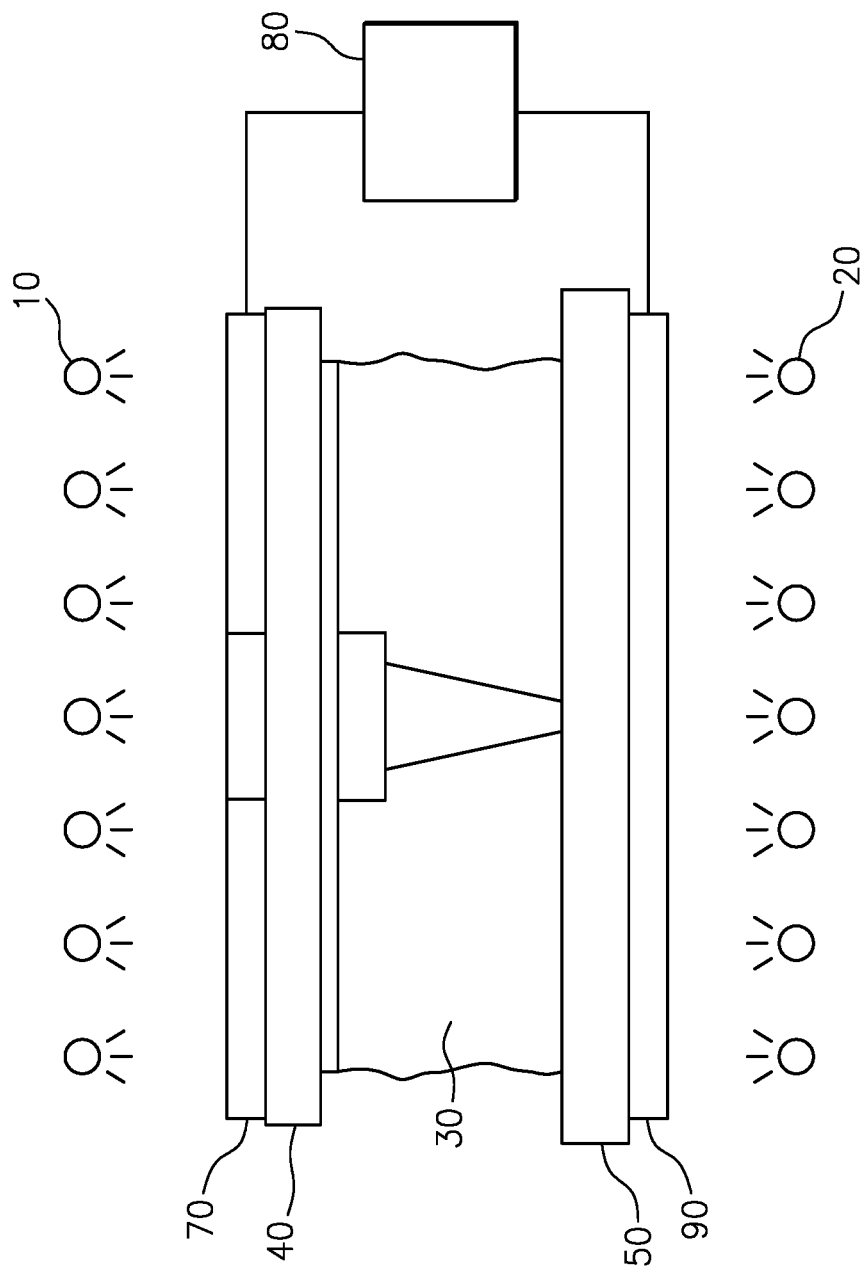
FIG. 2 depicts a liquid platemaking arrangement in accordance with another embodiment of the present invention.

In addition, as shown in FIG. 2, the present invention also relates generally to a system for producing a relief image printing plate from a liquid photopolymer resin, the system comprising:

a. an upper source of actinic radiation 10 and a lower source of actinic radiation 20 for exposing the liquid photopolymer resin 30 to actinic radiation to crosslink and cure portions of the liquid photopolymer resin 30;

b. a top exposure glass 40 and a bottom exposure glass 50 arranged between the upper source of actinic radiation 10 and the lower source of actinic radiation 20 for confining the liquid photopolymer resin 30 during production of the relief image printing plate;

c. a first programmable screen 90 arranged between the bottom exposure glass 50 and the lower source of actinic radiation 20, wherein the first programmable screen 90 is programmable with a first image file of a desired relief image, the first image file comprising transparent portions and opaque portions, wherein the transparent portions define areas where the liquid photopolymer 30 can be exposed to be exposure to actinic radiation from the lower source of actinic radiation 20 through the bottom exposure glass 50 to crosslink and cure portions of the liquid photopolymer 30, and wherein the opaque portions define areas where the liquid photopolymer 30 is not to exposed to actinic radiation and is not cured; and d. a second programmable screen 70 arranged between the top exposure glass 40 and the upper source of actinic radiation 10, wherein the second programmable screen 70 is programmable with a second image file of a desire floor image, said second image file comprising transparent portions and opaque portions.

The present invention provides a significant savings in film cost and mask preparation time over the techniques of the prior art.

The following sequence provides an example of a plate-making process using the programmable screen of the present invention which comprises the steps of:

a. Placing a relief image negative 60 on a bottom glass 50; (or, alternatively, placing a first programmable screen 90 below the bottom glass 50 above the lower light source 20);

b. Covering the relief image negative 60 with a clear cover film 65 to protect the relief image negative 60 (or, alternatively, protecting the bottom glass 50 with the clear cover film 65);

c. Turning on a vacuum source (not shown) to remove air from between the bottom glass 50, the relief image negative 60 (if used), and the clear cover film 65;

d. Pouring or casting liquid photopolymer 30 over the cover film 65;

e. Applying a polyester substrate 35 over the liquid photopolymer 30;

f. Lowering the top glass 40 over the plate-making arrangement;

g. Turning on a vacuum source (not shown) to remove air from between the upper glass 40 and the substrate 35;

h. Positioning a programmable screen 70 above the top glass 40, wherein the programmable screen 70 is programmed with an image file of a desired image;

i. Turning on the upper source of actinic radiation (upper UV lights) 10 to shine through the clear areas of the programmable screen 70 for a limited time, causing vertical regions in the liquid photopolymer 30 below the clear areas, adjacent to the polyester substrate 35, to polymerize a portion of the liquid photopolymer layer 30 and form island floor areas 100;

j. reprogramming the programmable screen 70 to exhibit an opaque screen to prevent light reflection from the upper glass 40 during the image exposure step;

k. Turning on the lower source of actinic radiation 20 (lower UV lights) to shine through the clear areas of the relief image negative 60 (or programmable screen 90), causing vertical regions in the un-polymerized liquid photopolymer above the clear areas (and below the vertical regions) to polymerize an additional amount of the liquid photopolymer layer 30 to form the relief image 105; and l. Removing the plate-making arrangement from the unit for further processing to reveal the relief image 105 therein.

It should also be understood that the following claims are intended to cover all of the generic and specific features of the invention described herein and all statements of the scope of the invention that as a matter of language might fall there between.

What is claimed is:

1. A system for producing a relief image printing plate from a liquid photopolymer resin, the system comprising:

a. an upper source of actinic radiation and a lower source of actinic radiation for exposing the liquid photopolymer resin to actinic radiation to crosslink and cure portions of the liquid photopolymer resin;

b. a top exposure glass and a bottom exposure glass arranged between the upper source of actinic radiation and the lower source of actinic radiation for confining the liquid photopolymer resin during production of the relief image printing plate;

c. a relief image negative arranged between the bottom exposure glass and the liquid photopolymer, wherein the relief image negative comprises transparent portions and opaque portions, wherein the transparent portions define areas where the liquid photopolymer can be exposed to be exposure to actinic radiation from the lower source of actinic radiation through the bottom exposure glass to crosslink and cure portions of the liquid photopolymer, and wherein the opaque portions define areas where the liquid photopolymer is not to exposed to actinic radiation and is not cured; and d. a programmable screen arranged between the top exposure glass and the upper source of actinic radiation, wherein the programmable screen is programmable with an image file of a desire image, said image file comprising transparent portions and opaque portions.

2. The system according to claim 1, wherein the programmable screen comprises a plurality of light valves or optical shutters, wherein each of the plurality of light valves or optical shutters are individually capable of switching between a first state in which incident radiation is blocked, whereby light is not transmitted, and a second state in which incident radiation is transmitted to follow a path through the light valve or optical shutter.

3. The system according to claim 2, further comprising a controller operatively connected to the programmable screen for individually controlling operation of each of the plurality of light valves or optical shutters in the programmable screen.

4. The system according to claim 3, wherein the controller comprises software for controlling operation of each of the plurality of light valves or optical shutters and data storage means for storing data related to each of the plurality of light valves or optical shutters.

5. The system according to claim 4, comprising a user interface for entering data into the data storage means and for selecting and modifying data related to the programmable screen.

6. A system for producing a relief image printing plate from a liquid photopolymer resin, the system comprising:

a. an upper source of actinic radiation and a lower source of actinic radiation for exposing the liquid photopolymer resin to actinic radiation to crosslink and cure portions of the liquid photopolymer resin;

b. a top exposure glass and a bottom exposure glass arranged between the upper source of actinic radiation and the lower source of actinic radiation for confining the liquid photopolymer resin during production of the relief image printing plate;

c. a first programmable screen arranged between the bottom exposure glass and the lower source of actinic radiation, wherein the first programmable screen is programmable with a first image file of a desired relief image, the first image file comprising transparent portions and opaque portions, wherein the transparent portions define areas where the liquid photopolymer can be exposed to be exposure to actinic radiation from the lower source of actinic radiation through the bottom exposure glass to crosslink and cure portions of the liquid photopolymer, and wherein the opaque portions define areas where the liquid photopolymer is not to exposed to actinic radiation and is not cured; and d. a second programmable screen arranged between the top exposure glass and the upper source of actinic radiation, wherein the second programmable screen is programmable with a second image file of a desire floor image, said second image file comprising transparent portions and opaque portions.

7. The system according to claim 6, wherein the first programmable screen and the second programmable screen each comprise a plurality of light valves or optical shutters, wherein each of the plurality of light valves or optical shutters are individually capable of switching between a first state in which incident radiation is blocked, whereby light is not transmitted, and a second state in which incident radiation is transmitted to follow a path through the light valve or optical shutter.

8. The system according to claim 6, further comprising a microcontroller operatively connected to the first programmable screen and the second programmable screen for individually controlling operation of each of the plurality of light valves or optical shutters in the first programmable screen and the second programmable screen.

9. The system according to claim 8, wherein the microcontroller comprises software for controlling operation of each of the plurality of light valves or optical shutters and data storage means for storing data related to each of the plurality of light valves or optical shutters for the first programmable screen and the second programmable screen.

10. The system according to claim 9, comprising a user interface for entering data into the data storage means and for selecting and modifying data related to the first programmable screen and the second programmable screen.

* * * * *